United States Patent
Michel et al.

(10) Patent No.: US 10,841,680 B2
(45) Date of Patent: Nov. 17, 2020

(54) MICROPHONE AND METHOD FOR PROCESSING AUDIO SIGNALS

(71) Applicants: Alan Michel, Shanghai (CN); Sean Gao, Shanghai (CN); Guangyue Lv, Shanghai (CN)

(72) Inventors: Alan Michel, Shanghai (CN); Sean Gao, Shanghai (CN); Guangyue Lv, Shanghai (CN)

(73) Assignee: Harman International Industries, Incorporated, Stamford, CT (US)

(*) Notice: Subject to any disclaimer, the term of this patent is extended or adjusted under 35 U.S.C. 154(b) by 0 days.

(21) Appl. No.: 16/322,817

(22) PCT Filed: Aug. 9, 2016

(86) PCT No.: PCT/CN2016/094217
§ 371 (c)(1),
(2) Date: Feb. 1, 2019

(87) PCT Pub. No.: WO2018/027583
PCT Pub. Date: Feb. 15, 2018

(65) Prior Publication Data
US 2019/0182574 A1 Jun. 13, 2019

(51) Int. Cl.
*H04R 1/04* (2006.01)
*H03F 3/185* (2006.01)
*H04R 3/00* (2006.01)

(52) U.S. Cl.
CPC ............ *H04R 1/04* (2013.01); *H03F 3/185* (2013.01); *H04R 3/00* (2013.01); *H04R 2430/01* (2013.01)

(58) Field of Classification Search
CPC ........ H04R 1/04; H04R 3/00; H04R 2430/01; H03F 3/185
See application file for complete search history.

(56) References Cited

U.S. PATENT DOCUMENTS 8,265,304 B2 * 9/2012 Osborne .................. H04R 5/02
381/122
8,324,969 B2 12/2012 Loeda et al.
(Continued)

FOREIGN PATENT DOCUMENTS

CN 101325819 A 12/2008
CN 101400009 A 4/2009
(Continued)

OTHER PUBLICATIONS

International Search Report dated May 12, 2017, PCT/CN2016/094217 filed Aug. 9, 2016, 12 pgs.
(Continued)

*Primary Examiner* — Mark Fischer
(74) *Attorney, Agent, or Firm* — Brooks Kushman P.C.

(57) ABSTRACT

The present disclosure provides a microphone including a main body, where an audio signal is generated in the main body based on the sound level and some other properties received, and an amplifier disposed in the main body, where the amplifier is adapted to amplify the audio signal, with the amplifier able to be configured with multiple gain levels. The present disclosure further provides a method for processing audio signals including: acquiring an audio signal; selecting a gain from multiple gain levels of an amplifier based on a property of the acquired audio signal, where the amplifier is built in a main body of a microphone; and modifying the digital representation after analog to digital conversion of the acquired audio signal according to the selected gain.

17 Claims, 3 Drawing Sheets

(56) References Cited

U.S. PATENT DOCUMENTS

| | | | |
|---|---|---|---|
| 9,413,317 B2 | 8/2016 | Kropfitsch et al. | |
| 2007/0274552 A1* | 11/2007 | Konchitsky | H04R 3/007 381/328 |
| 2009/0003629 A1 | 1/2009 | Shajaan et al. | |
| 2009/0052696 A1 | 2/2009 | Iwamatsu | |
| 2009/0086992 A1 | 4/2009 | Hsu et al. | |
| 2009/0096528 A1 | 4/2009 | Nakai et al. | |
| 2009/0285414 A1* | 11/2009 | Wu | H04R 3/06 381/113 |
| 2010/0246877 A1* | 9/2010 | Wang | H04R 19/005 381/361 |
| 2011/0150237 A1 | 6/2011 | Nagasue et al. | |
| 2013/0044898 A1* | 2/2013 | Schultz | H04R 3/06 381/111 |
| 2015/0086043 A1 | 3/2015 | Sridharan et al. | |

FOREIGN PATENT DOCUMENTS

| | | |
|---|---|---|
| CN | 103378813 A | 10/2013 |
| CN | 103858446 A | 6/2014 |
| CN | 104469608 A | 3/2015 |
| JP | H06217399 A | 8/1994 |

OTHER PUBLICATIONS

European Search Report for Application No. 16912038.3, dated Jan. 31, 2020, 7 pages.

* cited by examiner

MICROPHONE AND METHOD FOR PROCESSING AUDIO SIGNALS

CROSS-REFERENCE TO RELATED APPLICATION

This application claims the benefit of priority to PCT Patent Application No. PCT/CN2016/094217, filed on Aug. 9, 2016, and entitled "MICROPHONE AND METHOD FOR PROCESSING AUDIO SIGNALS", the entire disclosure of which is incorporated herein by reference.

TECHNICAL FIELD

The present disclosure relates to microphones, and more particularly, to a microphone including an amplifier with multiple gain levels and a method for processing audio signals.

BACKGROUND

In real situations, different configurations for a microphone are required in order to well handle different scenarios. A microphone with a constant gain configuration could apply to one or several scenarios but fail to operate well in other scenarios, which results in overall performance degradation for the microphone.

SUMMARY

Embodiments of the present disclosure provide a microphone including: a main body, where an analog audio signal is generated in the main body representing an audio sound received by the microphone; and an amplifier disposed in the main body, where the amplifier is adapted to amplify the analog signal representation of the audio sound, and the amplifier is configured with multiple gain levels.

In some embodiments, the amplifier may include a non-inverting amplifier and an analog switch. In some embodiments, the amplifier may include: an operational amplifier including a non-inverting input, an inverting input and an output; an analog switch, where a first end of the analog switch is coupled with the inverting input and a second end of the analog switch is coupled with the output; a first resistor, where a first end of the first resistor is coupled with the first end of the analog switch and a second end of the first resistor is coupled with the second end of the analog switch; and a second resistor, where a first end of the second resistor is coupled with the first end of the first resistor and a second end of the second resistor is grounded. In some embodiments, the operational amplifier may be a Junction gate Field-Effect Transistor (JFET) input operational amplifier.

In some embodiments, in order to achieve a non-unity gain of 30 dB for the amplifier, the first resistor may have impedance thirty times the second resistor. For example, impedance of the first resistor is 30K ohm and impedance of the second resistor is 1K ohm results in a gain of 31. Thus, in the decibel scale, $20*\log_{10}31$ is 29.83 dB that is rounded to 30 dB.

In some embodiments, the microphone may further include: an Analog to Digital converter (A/D converter) adapted to convert the amplified audio signal from an analog signal representation to a digital signal representation to acquire a digital audio signal; and a bit shifter adapted to shift the digital signal representation by at least one bit based on the multiple gain levels. In some embodiments, the digital audio signal may include more than 16 bits. In some embodiments, the digital audio signal may include 21 bits or even more depending on minimum and maximum gain and A/D converter word length.

In some embodiments, the bit shifter may shift the digital audio signal to the left by at least one bit to compensate for a highest gain among the multiple gain levels. For an example of two gains including a unity gain and a non-unity gain, if the unity gain is configured to amplify an analog audio signal, the bit shifter shifts a corresponding digital audio signal to the left by at least one bit corresponding to the non-unity gain. In some embodiments, quantity of bits shifted may be a gain difference against the highest gain divided by 6 dB. For example, if a gain difference between two gains (such as 30 dB and 12 dB) is 18 dB, the bit shifter shifts the digital audio signal to the left by 3 bits. Thus, digital audio signals from the A/D converter are properly scaled to the highest gain.

In some embodiments, the microphone may further include: a controller configured to select a gain from the multiple gain levels based on a property of the analog audio signal. In some embodiments, the controller may select a gain from the multiple gain levels via comparing energy of the analog audio signal to a threshold relevant to the property of the analog audio signal. In some embodiments, the controller may further be configured to transmit either the selected gain or quantity of bits to be shifted corresponding to the gain difference to the bit shifter.

In some embodiments, the multiple gain levels may include a unity gain and at least one non-unity gain. In some embodiments, the at least one non-unity gain may include any gain greater than the unity gain. In some embodiments, the at least one non-unity gain may include at least one of multiples of six decibels. In some embodiments, the multiple gain levels may include 0 dB and 30 dB.

The embodiments of the present disclosure may further include a method for processing audio signals including: acquiring an analog audio signal; selecting a gain from multiple gain levels of an amplifier based on a property of the acquired analog audio signal, where the amplifier is built in a main body of a microphone; and amplifying the acquired analog audio signal according to the selected gain.

In some embodiments, the gain may be selected from the multiple gain levels via comparing energy of the acquired analog audio signal to a threshold relevant to the property of the acquired analog audio signal.

In some embodiments, the method may further include: converting the amplified audio signal from an analog signal representation to a digital signal representation to acquire a digital audio signal; and shifting the digital audio signal by at least one bit based on the multiple gain levels. In some embodiments, the digital audio signal may include more than 16 bits.

In some embodiments, the bit shifter may shift the digital audio signal to the left by at least one bit to properly scale the digital audio signal based on a highest gain among the multiple gain levels. In some embodiments, quantity of bits shifted may be a gain difference against the highest gain divided by 6 dB.

In some embodiments, the multiple gain levels may include a unity gain and at least one non-unity gain. In some embodiments, the at least one non-unity gain may include any gain greater than the unity gain. In some embodiments, the at least one non-unity gain may include at least one of multiples of six decibels.

A microphone including an amplifier with multiple gain levels can have flexibility in gain selection so as to improve overall performance for different scenarios. Further, a wider dynamic range can be realized without changing effective sensitivity and scaling of audio signals.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered as limitation to its scope, the disclosure will be described with additional specificity and detail through use of the accompanying drawings.

DETAILED DESCRIPTION

Figure 1:
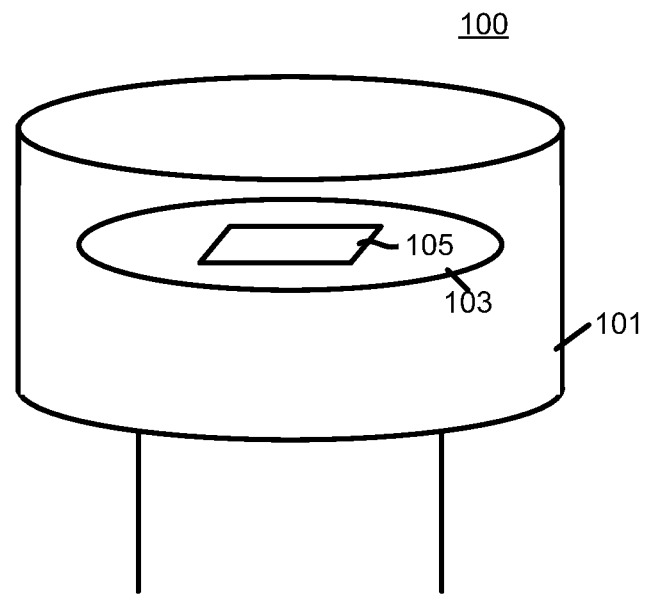
FIG. 1 schematically illustrates a structural diagram for a microphone according to an embodiment in the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limitation. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

The embodiments of the present disclosure provide a microphone including an amplifier with multiple gain levels. FIG. 1 schematically illustrates a structural diagram for a microphone 100 according to an embodiment in the present disclosure. The microphone 100 includes a main body 101, where the main body 101 includes a backplate 103 and an amplification system 105 disposed on the backplate 103. Specifically, an analog audio signal is generated in the main body 101 based on an audio sound received by the microphone 100. In some embodiments, the backplate 103 may be a printed wire board.

Figure 2:
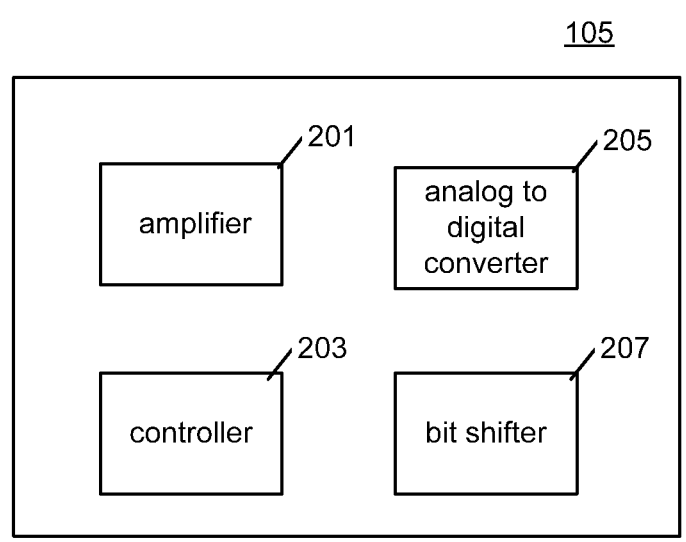
FIG. 2 schematically illustrates a structural diagram for the amplification system as shown in FIG. 1 according to an embodiment in the present disclosure.

The amplification system 105 is adapted to amplify the analog audio signal so as to acquire an amplified audio signal. FIG. 2 schematically illustrates a structural diagram for the amplification system 105 as shown in FIG. 1 according to an embodiment in the present disclosure. Referring to FIG. 2, the amplification system 105 at least includes an amplifier 201 and a controller 203.

The amplifier 201 is adapted to amplify the analog audio signal, and the amplifier 201 is configured with multiple gain levels. In some embodiments, the multiple gain levels may include a unity gain (namely, a gain with zero decibel (dB)) and at least one non-unity gain. In some embodiments, the at least one non-unity gain may include any gain greater than 0 dB. In some embodiments, the at least one non-unity gain may include multiples of 6 dB. In some embodiments, the at least one non-unity gain may include a single gain, such as 30 dB, where 30 dB is typically used for a microphone to listen to a speaker who is several meters away from the microphone. In some embodiments, the at least one non-unity gain may include multiple gains, such as 18 dB, 30 dB and 42 dB, where 30 dB is used for a microphone to listen to a first sound source such as a talker, that is several meters away from the microphone, 18 dB is used when the microphone is listening to a second sound source that is closer and/or louder than the first sound source, but still several meters away from the microphone, and 42 dB is used for the microphone to listen to a third sound source that is farther and/or weaker than the first sound source or even more distant or weaker sounds.

Figure 3:
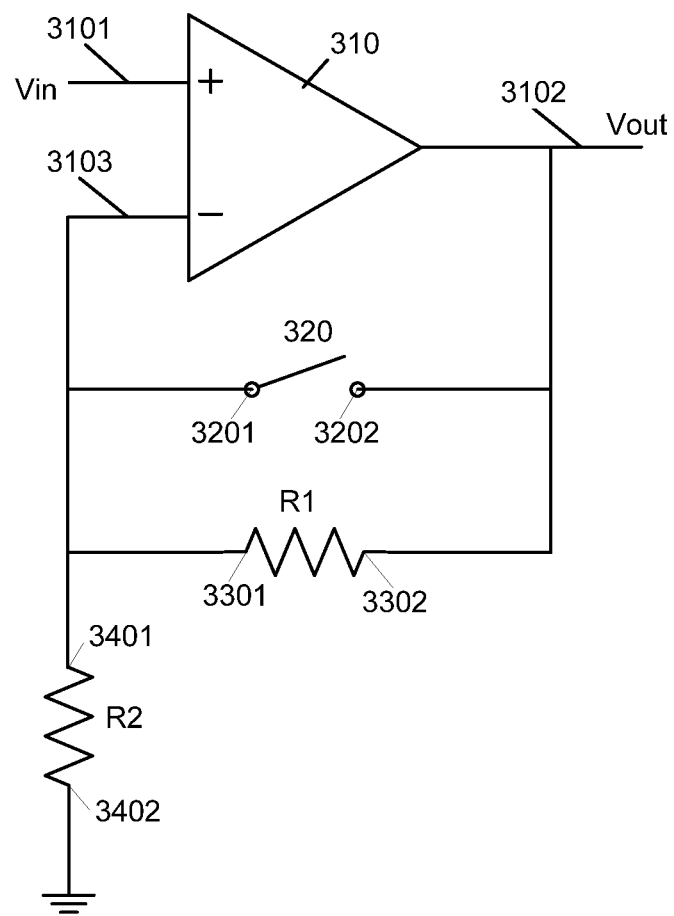
FIG. 3 schematically illustrates an example of a structural diagram for the amplifier as shown in FIG. 2 according to an embodiment in the present disclosure.

In some embodiments, the amplifier 201 may include a non-inverting amplifier including multiple impedances and multiple analog switches. FIG. 3 schematically illustrates an example of a structural diagram for the amplifier 201 as shown in FIG. 2 according to an embodiment in the present disclosure. Referring to FIG. 3, the amplifier 201 includes an operational amplifier 310, an analog switch 320, a first resistor R1 and a second resistor R2. The operational amplifier 310 has a non-inverting input 3101, an inverting input 3103 and an output 3102, where an input voltage Vin is applied to the non-inverting input 3101 and an output voltage Vout is obtained at the output 3102. Specifically, the amplifier 201 is a non-inverting amplifier. In some embodiments, the operational amplifier 310 may be a JFET input operational amplifier, thus in this case, the amplifier 201 is a JFET input non-inverting amplifier.

Further referring to FIG. 3, a first end 3201 of the analog switch 320 is coupled with the inverting input 3103 and a second end 3202 of the analog switch 320 is coupled with the output 3102. Moreover, a first end 3301 of the first resistor R1 is coupled with the first end 3201 and a second end 3302 of the first resistor R1 is coupled with the second end 3202. Moreover, a first end 3401 of the second resistor R2 is coupled with the first end 3301 and a second end 3402 of the second resistor R2 is grounded.

Technically, if the analog switch 320 is closed, the first resistor R1 is short circuited, thus the amplifier 201 serves as a unity amplifier with a gain of 0 dB. Otherwise, the amplifier 201 serves as a non-inverting amplifier with a gain determined according to the first resistor R1 and the second resistor R2. Specifically, the gain in decibels is acquired by calculating the following expression:

$$20*\mathrm{Log}_{10}(1+R1/R2) \tag{1}$$

For an example, a resistance of the first resistor R1 is thirty times that of the second resistor R2, thus the gain is about 30 dB according to the expression (1).

In some embodiments, the amplifier 201 may include other types of amplifiers, such as an inverting amplifier.

The controller 203 is configured to select a gain from the multiple gain levels based on a property, such as a total short term average level or a sample by sample level or a property of the analog audio signal. Wherein, the property of the analog audio signal may be energy, a peak to average energy crest factor, remaining headroom margin, etc. In some embodiments, the controller 203 is configured to select a gain from the multiple gain levels via comparing energy of the analog audio signal to a threshold relevant to the property of the analog audio signal. For example, human speech generally has a crest factor of 12 dB. When listening to the human speech using a first gain, if a short term energy of a speech data block has energy less than 12 dB down from the Acoustic Overload Point (AOP) where audio signals will clip, a second gain is selected to replace the first gain, where the first gain is greater than the second gain. In some embodiments, the controller may be further configured to delay switching of the gain to occur during or after a zero-crossing of the analog audio signal so as to minimize any click in the audio sound that the gain change may produce with an larger instantaneous audio signal level when the analog audio signal is large.

Accordingly, when a system interested in a distant sound, a non-unity gain setting of the microphone amplifier is selected for the distant sound. When the microphone is close to a source of loud sound, such as a loudspeaker, or other source of loud sound, or the microphone and sound source are both included inside a device or a system, the unity gain is selected by the controller and assigned to the amplifier, and an echo cancellation process could be performed on an audio signal with unity gain, where the echo cancellation process requires a stationary signal path between the sound source and microphone.

In some embodiments, the amplification system 105 may further include an analog to digital converter (A/D converter) 205 and a bit shifter 207.

The analog to digital converter 205 is adapted to convert the amplified audio signal from an analog signal representation to a digital signal representation to acquire a digital audio signal. Typically, a 16-bit A/D converter is used, thus the digital audio signal includes 16 bits. In some embodiments, the digital audio signal may include more than 16 bits, such as 21 bits. In some embodiments, a Codec may be used instead of the A/D converter 205 to convert the amplified audio signal from an analog signal representation to a digital signal representation.

After performing the quantization, each bit in a digital audio signal represents 6 dB of a dynamic range between the AOP and a quantization noise floor. Therefore, for a 16-bit system, a dynamic range of 96 dB is obtained, and for a 21-bit system, a dynamic range of 126 dB is obtained. For a digital audio signal, a wider dynamic range is better.

The bit shifter 207 is adapted to bit shift the digital audio signal based on the multiple gain levels. Specifically, the at least one non-unity gain may include at least one of multiples of 6 dB so that a simple shifting of bits could be applied instead of a more complicated scaling method involving multiplication hardware. In some embodiments, the bit shifter 207 may shift the digital audio signal to the left by at least one bit to compensate for a highest gain among the multiple gain levels. In some embodiments, quantity of bits shifted may be a gain difference against the highest gain divided by 6 dB, since each bit in a digital audio signal represents 6 dB. For an example of two gains including 0 dB and 30 dB, the digital audio signal with 0 dB is shifted to the left by 5 bits to scale the digital audio signal with 0 dB in an absolute sense to be equivalent to a digital audio signal with 30 dB gain. For another example of three gains including 0 dB, 18 dB and 30 dB, a digital audio signal with 18 dB is shifted to the left by 2 bits to achieve the same scaling as an unshifted digital audio signal with 30 dB gain, and a digital audio signal with 0 dB is shifted to the left by 5 bits to achieve the same scaling as the unshifted digital audio signal with 30 dB gain. Therefore, after performing the bit shift, digital audio signals have a consistent linear value as expected since digital audio signals with different gains are modified through the bit shift so as to achieve the consistent linear values, thus absolute scaling of the digital audio signals is consistent. In some embodiments, the digital audio signals may be properly scaled in an absolute sense as a 21 bit digital word for further signal processing.

In some embodiments, the bit shifter 207 may acquire gains from the controller 203. In some embodiments, the bit shifter 207 may acquire gains based on the digital audio signal from the A/D converter 205. Specifically, a digital audio signal with a greater value may require a lower gain against a digital audio signal with a smaller value to get even with the highest gain. In some embodiments, the bit shifter 207 may acquire quantity of bits to be shifted according to a gain acquired from the controller 203. In some embodiments, the bit shifter 207 may acquire quantity of bits to be shifted from the controller 203. In these cases, the acquired gains are modified by the bit shifter 207 to become consistent with the highest gain.

Accordingly, a downstream processing is not required to be aware of the gain used by the amplifier 201 for a particular audio signal, so that digital audio signals after performing the bit shift appear stationary to the downstream processing. For example, the digital audio signals after performing the bit shift have a consistent gain so that the echo cancellation process is performed on the digital audio signals without knowing the specific instantaneous gain used by the amplifier 201.

Figure 4:
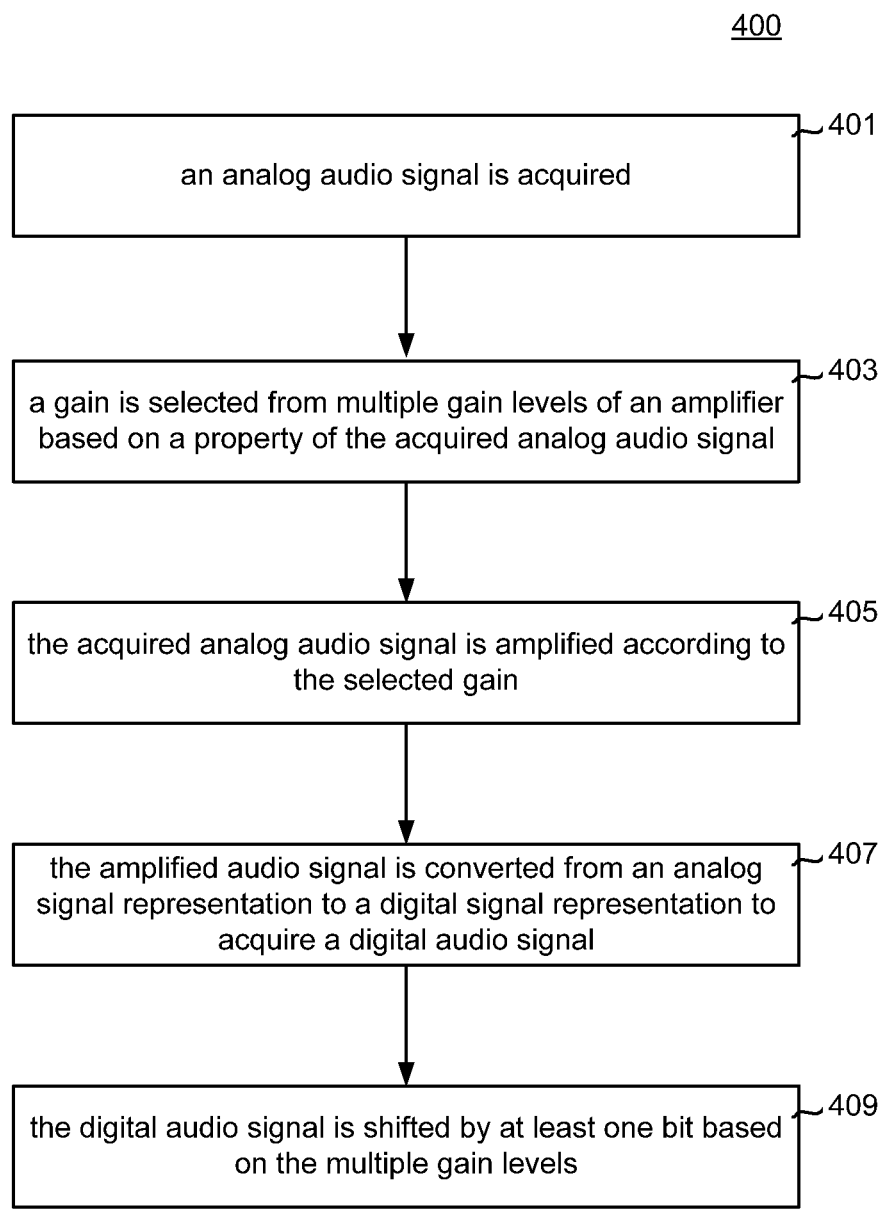
FIG. 4 schematically illustrates a flow diagram for a method for processing audio signals according to an embodiment in the present disclosure.

The embodiments of the present disclosure further provide a method for processing audio signals. FIG. 4 schematically illustrates a flow diagram for a method for processing audio signals 400 according to an embodiment in the present disclosure.

In the step 401, an analog audio signal is acquired.

In the step 403, a gain is selected from multiple gain levels of an amplifier based on a property of the acquired analog audio signal. Wherein, the amplifier may be disposed on a backplate included in a main body of a microphone, and the property may be energy, a peak to average energy crest factor, remaining headroom margin, etc. as previously described.

In some embodiments, the gain may be selected from the multiple gain levels via comparing energy of the acquired analog audio signal to a threshold relevant to the property of the acquired analog audio signal, such as an acoustic overload point (AOP).

In some embodiments, the multiple gain levels may include a unity gain of 0 dB and at least one non-unity gain. In some embodiments, the at least one non-unity gain may include any gain greater than 0 dB. In some embodiments, the at least one non-unity gain may include at least one of multiples of 6 dB. In some embodiments, the multiple gain levels may include 0 dB and 30 dB. In some embodiments, the multiple gain levels may include 0 dB, 18 dB, 30 dB and 42 dB.

In the step 405, the acquired analog audio signal is amplified according to the selected gain.

Accordingly, an amplifier of a microphone amplifies a distant sound according to a non-unity gain. And, the unity gain is selected and assigned to the amplifier when cancelling a much louder echo generated due to a short and direct path from the source of loudspeaker sound close to the microphone or inside a device or system including the microphone.

In the step 407, the amplified audio signal is converted from an analog signal representation to a digital signal representation to acquire a digital audio signal. In some embodiments, the digital audio signal includes more than 16 bits. In some embodiments, the digital audio signal includes 21 bits corresponding to a dynamic range of 126 dB.

In the step 409, the digital audio signal is shifted by at least one bit based on the multiple gain levels. Specifically, the at least one non-unity gain may include at least one of multiples of 6 dB so that a simple shifting of bits could be applied instead of a more complicated scaling method involving multiplication hardware. In some embodiments, the digital audio signal may be shifted to the left by at least one bit to compensate for the highest gain among the multiple gain levels. In some embodiments, quantity of bits shifted may be a gain difference against the highest and lowest gain divided by 6 dB. Accordingly, digital audio signals after performing the bit shift have a consistent gain and appear stationary to a downstream processing such as an echo cancellation process.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A microphone comprising:
    a main body, where an analog audio signal is generated in the main body based on a sound;
    an amplifier, disposed in the main body, where the amplifier is adapted to amplify the analog audio signal and the amplifier is configured with a plurality of gain levels,
    wherein the plurality of gain levels comprise a unity gain and at least one non-unity gain;
    an analog to digital converter adapted to convert the amplified audio signal from an analog signal representation to a digital signal representation to acquire a digital audio signal; and
    a bit shifter adapted to shift the digital audio signal by at least one bit based on the plurality of gain levels.

2. The microphone according to claim 1, wherein the amplifier comprises a non-inverting amplifier and a switch.

3. The microphone according to claim 2, wherein the amplifier comprises:
    an operational amplifier includes a non-inverting input, an inverting input and an output;
    a switch including a first end and a second end, where the first end of the switch is coupled with the inverting input the second end of the switch is coupled with the output;
    a first resistor including a first end and a second, where the first end of the first resistor is coupled with the first end of the switch and the second end of the first resistor is coupled with the second end of the switch; and
    a second resistor including a first end and a second end, where the first end of the second resistor is coupled with the first end of the first resistor and the second end of the second resistor is grounded.

4. The microphone according to claim 3, wherein the first resistor has an impedance that is thirty times an impedance of the second resistor.

5. The microphone according to claim 3, wherein the operational amplifier is a Junction gate Field-Effect Transistor (JFET) input operational amplifier.

6. The microphone according to claim 1, wherein the digital audio signal comprises more than 16 bits.

7. The microphone according to claim 1, wherein the bit shifter shifts the digital audio signal to the left by at least one bit to compensate for a highest gain among the plurality of gain levels.

8. The microphone according to claim 7, wherein a quantity of bits shifted is a gain difference against the highest gain divided by six decibels.

9. The microphone according to claim 1 further comprising a controller configured to select a gain from the plurality of gain levels based on a property of the analog audio signal.

10. The microphone according to claim 9, wherein the controller is further configured to select a gain from the plurality of gain levels via comparing energy of the analog audio signal to a threshold relevant to the property of the analog audio signal.

11. The microphone according to claim 9, wherein the controller is further configured to transmit the gain or a quantity of bits to be shifted corresponding to the gain to a bit shifter.

12. The microphone according to claim 1, wherein the at least one non-unity gain comprises at least one of multiples of six decibels.

13. A method for processing audio signals comprising:
    acquiring an analog audio signal;
    selecting a gain from a plurality of gain levels of an amplifier based on a property of the acquired analog audio signal, where the amplifier is built in a main body of a microphone; and
    amplifying the acquired analog audio signal according to the selected gain,
    wherein the gain is selected from the plurality of gain levels via comparing energy of the acquired analog audio signal to a threshold relevant to the property of the acquired analog audio signal.

14. The method according to claim 13 further comprising:
    converting the amplified audio signal from an analog signal representation to a digital signal representation to acquire a digital audio signal; and
    shifting the digital audio signal by at least one bit based on the plurality of gain levels.

15. The method according to claim 14, wherein the digital audio signal comprises more than 16 bits.

16. The method according to claim 14, wherein shifting the digital audio signal comprises shifting the digital audio signal to the left by at least one bit to compensate for a highest gain among the plurality of gain levels.

17. A microphone comprising:
    a main body configured to generate an analog audio signal based on a sound;
    an amplifier positioned in the main body and being adapted to amplify the analog audio signal, where the amplifier is configured with a plurality of gain levels;
    wherein the plurality of gain levels comprise a unity gain and at least one non-unity gain;
    an analog to digital converter adapted to convert the amplified audio signal from an analog signal representation to a digital signal representation to acquire a digital audio signal; and
    a bit shifter adapted to shift the digital audio signal by at least one bit based on the plurality of gain levels.

* * * * *